(12) United States Patent
Katayama

(10) Patent No.: US 8,779,454 B2
(45) Date of Patent: Jul. 15, 2014

(54) LIGHT EMITTING ELEMENT AND IMAGE DISPLAY DEVICE USING THE LIGHT EMITTING ELEMENT

(75) Inventor: Ryuichi Katayama, Minato-ku (JP)

(73) Assignee: NEC Corporation, Tokyo (JP)

( * ) Notice: Subject to any disclaimer, the term of this patent is extended or adjusted under 35 U.S.C. 154(b) by 181 days.

(21) Appl. No.: 13/520,958

(22) PCT Filed: Jan. 5, 2011

(86) PCT No.: PCT/JP2011/050051
§ 371 (c)(1),
(2), (4) Date: Jul. 6, 2012

(87) PCT Pub. No.: WO2011/083803
PCT Pub. Date: Jul. 14, 2011

(65) Prior Publication Data
US 2012/0280265 A1    Nov. 8, 2012

(30) Foreign Application Priority Data
Jan. 7, 2010  (JP) .................................. 2010-002068

(51) Int. Cl.
*H01L 33/00* (2010.01)
(52) U.S. Cl.
USPC ..................... 257/98; 257/79; 257/E33.072
(58) Field of Classification Search
USPC .................................................. 257/98, 79
See application file for complete search history.

(56) References Cited

U.S. PATENT DOCUMENTS

| 6,785,320 B1 | 8/2004 | Amos et al. |
| 2005/0205884 A1 | 9/2005 | Kim et al. |

(Continued)

FOREIGN PATENT DOCUMENTS

| JP | 2001-83321 A | 3/2001 |
| JP | 2003-504880 A | 2/2003 |

(Continued)

OTHER PUBLICATIONS

Christian Hoepfner, "Invited Paper: PhlatLight™ Photonic Lattice LEDs for RPTV Light Engines", SID Digest, 2006, 99. 1808-1811, 61.1.

(Continued)

*Primary Examiner* — Thien F Tran
(74) *Attorney, Agent, or Firm* — Sughrue Mion, PLLC

(57) ABSTRACT

The present invention provides a light emitting element which emits linearly polarized light, has high efficiency, can show a higher luminance and has also adequate productivity. The light emitting element that includes an active layer composed of a semiconductor which generates light includes: a polarizer layer that allows a polarized component in a first direction among the lights generated in the active layer to pass therethrough, reflects a polarized component in a second direction which is perpendicular to the first direction, is formed on a semiconductor of the same group as the active layer, and contains a semiconductor or a metal of the same group as the active layer; a reflective layer that is provided in the opposite side of the polarizer layer with respect to the active layer, and reflects light which has been reflected by the polarizer layer; and a wavelength plate layer that is provided between the polarizer layer and the reflective layer, changes polarization states of the light which has been reflected by the polarizer layer and the light which has been reflected by the reflective layer, and contains a semiconductor of the same group as the active layer.

9 Claims, 7 Drawing Sheets

(56) References Cited

U.S. PATENT DOCUMENTS

| | | | |
|---|---|---|---|
| 2007/0081253 A1 | 4/2007 | Yamauchi | |
| 2008/0054283 A1 | 3/2008 | Min et al. | |
| 2010/0127238 A1* | 5/2010 | Kim et al. | 257/13 |
| 2010/0226404 A1 | 9/2010 | Kim et al. | |

FOREIGN PATENT DOCUMENTS

| | | |
|---|---|---|
| JP | 2005-268809 A | 9/2005 |
| JP | 2007-109689 A | 4/2007 |
| JP | 2008-60534 A | 3/2008 |
| JP | 2008-180788 A | 8/2008 |
| JP | 2009-111012 A | 5/2009 |
| JP | 2009-117641 A | 5/2009 |
| WO | 2007/108212 A1 | 9/2007 |

OTHER PUBLICATIONS

International Search Report for PCT/JP2011/050051 dated Feb. 8, 2011.

* cited by examiner

LIGHT EMITTING ELEMENT AND IMAGE DISPLAY DEVICE USING THE LIGHT EMITTING ELEMENT

CROSS REFERENCE TO RELATED APPLICATIONS

This application is a National Stage of International Application No. PCT/JP2011/050051 filed Jan. 5, 2011, claiming priority based on Japanese Patent Application No. 2010-002068 filed Jan. 7, 2010, the contents of all of which are incorporated herein by reference in their entirety.

TECHNICAL FIELD

The present invention relates to a light emitting element which emits linearly polarized light and an image display device using the light emitting element.

BACKGROUND ART

An image display device is proposed which uses a light emitting diode (LED) as a light emitting element. This type of the image display device includes a structure which includes: a plurality of LEDs which emit lights with each having a red (R), green (G) and blue (B) colored component; an illumination optical system in which lights emitted from the plurality of LEDs are incident; a light valve including a liquid crystal display panel on which lights emitted from the illumination optical system are incident; a color synthesizing prism which synthesizes the lights with each color emitted from the light valve; and a projection optical system for projecting lights emitted from the color synthesizing prism onto a projection surface. A semiconductor is used for the LED, and a semiconductor of groups III to V is usually used.

In order to enhance the luminance of a projected image, the requirement for an image display device that includes the above described structure is that, to the extent possible, it not generates optical loss in a light path from the light emitting element to the projection optical system.

Among the above described structural components, the liquid crystal display panel and the color synthesizing prism are components having polarization dependency, and accordingly it is desirable that the light emitting element emit linearly polarized light, in order to give the optical system higher efficiency.

In addition, as is described in Non Patent Literature 1 (SID 06 DIGEST, 2006, pp. 1808-1811, 61.1, Photonic Lattice LEDs for RPTV Light Engines, Christian Hoepiher), the efficiency of the optical system is restricted due to the etendue (Etendue) which is determined by a product of an area of the light emitting element and the radiation angle. Specifically, if the value of a product of the area of the light emitting element and the radiation angle is not controlled to be equal or less than the value of a product of an area of an entrance surface of the light valve and a light acceptance angle which is determined by an F number of the illumination optical system, the light emitted from the light emitting element will not be used as projection light.

For this reason, in the image display device using the LED, what is pending is to find a way to enhance the luminance of the light emitting element without enlarging the area of the light emitting element, in order to reduce the etendue of the light emitted from the light emitting element.

For the purpose of emitting a light having a large polarization ratio, Patent Literature 1 (JP2009-111012A) discloses a semiconductor light emitting element which has been prepared so that a nonpolar surface becomes the principal surface of crystal growth.

For the purpose of reducing the etendue and emitting linearly polarized light with high polarization conversion efficiency, Patent Literature 2 (JP 2007-109689A) discloses a light emitting element including: a light emitting portion which is provided on a reference plane and emits light; a $\lambda/4$ phase plate provided in an emission surface side of the light-emitting portion; a reflection-type polarizing plate which is provided in the emission surface side of the $\lambda/4$ phase plate, allows polarized light in a first vibration direction to pass therethrough and reflects polarized light in a second vibration direction which is perpendicular to the first vibration direction; and an optical portion which is provided in the emission surface side of the reflection-type polarizing plate and in which the refractive index periodically changes in two directions within a plane that is parallel to the reference plane.

CITATION LIST

Patent Literature

Patent Literature 1: JP2009-111012A
Patent Literature 2: JP 2007-109689A

Non Patent Literature

Non Patent Literature 1: SID 06 DIGEST, 2006, pp. 1808-1811, 61.1, Photonic Lattice LEDs for RPTV Light Engines, Christian Hoepiher

SUMMARY OF INVENTION

Technical Problem

In the semiconductor light emitting element described in Patent Literature 1, a nonpolar surface becomes the principal surface of crystal growth, and accordingly it is necessary to cut out a substrate whose nonpolar surface is a main surface from an ordinary substrate whose polar surface is the main surface and to use the cut out substrate. For this reason, the semiconductor light emitting element cannot enlarge the area of the substrate and has a problem in which the productivity is poor.

In the light emitting element described in Patent Literature 2, the polarization direction of emitted light is uniformized by using a reflection-type polarizing plate; the light reflected by the reflection-type polarizing plate is reflected by a reflective electrode provided in an opposite side to the emission surface of a light emitting portion, and is reciprocated between the reflective electrode and a $\lambda/4$ phase plate; thereby the vibration direction is changed by 90'; and the resultant light is again incident on the reflection-type polarizing plate, and passes through the reflection-type polarizing plate.

However, because a part of the light reflected by the reflection-type polarizing plate and the light reflected by the reflective electrode is reflected on the emission surface of the light-emitting portion placed between the reflection-type polarizing plate and the reflective electrode, the efficiency of polarization conversion is low taking into consideration light attenuation caused by multiple reflection, and there is a problem in which it is difficult to obtain a higher luminance.

In addition, because the $\lambda/4$ phase plate is not electrically conductive, an electrode in the emission surface side of the light-emitting portion cannot be provided on the emission surface of the light emitting element, and it is necessary to remove a part of the reflection-type polarizing plate and the λ/4 phase plate, and provide the electrode in the emission surface of the light-emitting portion. Then, there is a problem in which the productivity is poor.

The present invention is designed with respect to the above described problems in the Related Art, and an object of the present invention is to provide a light emitting element which emits linearly polarized light, has high efficiency, can show a higher luminance and also has adequate productivity.

Solution to Problem

The light emitting element according to the present invention is a light emitting element including an active layer composed of a semiconductor which generates light, and includes:

a polarizer layer that allows a polarized component in a first direction among the lights generated in the active layer to pass therethrough, reflects a polarized component in a second direction which is perpendicular to the first direction, is formed on a semiconductor of the same group as the active layer, and contains a semiconductor or a metal of the same group as the active layer;

a reflective layer that is provided in the opposite side of the polarizer layer with respect to the active layer, and reflects the light which has been reflected by the polarizer layer; and a wavelength plate layer that is provided between the polarizer layer and the reflective layer, changes polarization states of the light which has been reflected by the polarizer layer and the light which has been reflected by the reflective layer, and contains a semiconductor of the same group as the active layer.

The image display device according to the present invention employs a light emitting element including the above described structure.

Advantageous Effects of Invention

The light emitting element according to the present invention is an element which uniformizes the polarization directions of emitted lights by using a polarizer layer; the light which has been reflected by the polarizer layer is reflected by a reflective layer and is reciprocated between the reflective layer and a wavelength plate layer; thereby the polarization state is changed; and the resultant light is incident on the polarizer layer again, and passes through the polarizer layer.

The active layer is composed of the semiconductor, the polarizer layer is formed on a semiconductor of the same group as the active layer and contains a semiconductor or a metal of the same group as the active layer, and the wavelength plate layer contains a semiconductor of the same group as the active layer. Thereby, the light emitting element can achieve a state in which there is no surface that reflects light between the polarizer layer and the reflective layer, and accordingly the efficiency of polarization conversion is high, and can show a higher luminance.

In addition, an electrode can be provided on the emission surface of the light emitting element because the polarizer layer and the wavelength plate layer are electrically conductive, and the area of the substrate can be enlarged by using an ordinary substrate of which the polar surface is the main surface. Accordingly, the productivity is adequate.

DESCRIPTION OF EMBODIMENTS

A specific exemplary embodiment according to the present invention will be described below with reference to the drawings.

Figure 1:
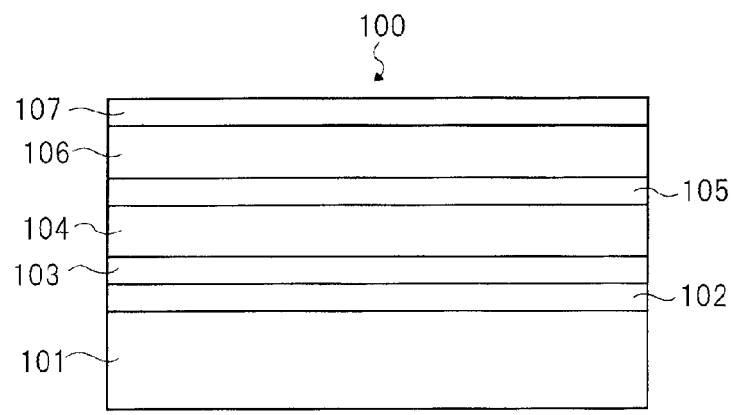
FIG. 1 is a sectional view illustrating a structure of one exemplary embodiment of a light emitting element according to the present invention.

FIG. 1 is a sectional view illustrating a structure of one exemplary embodiment of light emitting element 100 according to the present invention. In light emitting element 100, the thicknesses of actual respective layers are extremely thin and differences among the thicknesses of the respective layers are large; and accordingly it is difficult to draw a figure in which ratios of the respective layers are accurate. For this reason, in the figure, the respective layers are not drawn according to the actual ratios but are schematically illustrated.

Reflective layer 102, wavelength plate layer 103, P-type semiconductor layer 104, active layer 105, N-type semiconductor layer 106 and polarizer layer 107 are stacked in this order on submount 101. A P-type electrode, not shown, is formed on the lower face of submount 101, and an N-type electrode, not shown, is formed on the upper face of polarizer layer 107.

Si, for instance, is used for a material of submount 101. Al, for instance, is used for a material of reflective layer 102.

When light emitting element 100 emits blue or green colored light, GaN which has been doped with Mg, for instance, is used for a material of P-type semiconductor layer 104. A multiple quantum well structure is used for active layer 105, in which a layer using GaN as a material and a layer using InGaN as a material are alternately stacked, for instance. GaN which has been doped with Si, for instance, is used for a material of N-type semiconductor layer 106. Any one of the materials is a semiconductor of groups III to V.

When light emitting element 100 emits light having a red colored component, InGaAlP which has been doped with Zn, for instance, is used for the material of P-type semiconductor layer 104. A multiple quantum well structure is used for active layer 105, in which a layer using InGaP as a material and a layer using InGaAlP as a material are alternately stacked, for instance. The InGaAlP which has been doped with Si, for instance, is used for the material of N-type semiconductor layer 106. Any one of the materials is a semiconductor of groups III to V. An alloy containing Au, for instance, is used for the materials of the P-type electrode and the N-type electrode.

A method for manufacturing light emitting element 100 will be described below. Firstly, N-type semiconductor layer 106, active layer 105 and P-type semiconductor layer 104 are sequentially formed on a substrate. Next, wavelength plate layer 103 is formed on P-type semiconductor layer 104. Next, reflective layer 102 is formed on wavelength plate layer 103. Next, reflective layer 102 is affixed on submount 101, and the substrate is removed. Next, polarizer layer 107 is formed on N-type semiconductor layer 106. Finally, the P-type electrode and the N-type electrode are formed.

A brief summary of the operation of the present exemplary embodiment will be described below. Light is generated in active layer 105 by applying a voltage between the P-type electrode and the N-type electrode and passing an electric current between the electrodes. The light which has been generated in active layer 105 contains components heading for various directions.

The light which is generated in active layer 105 and heads for an N-type semiconductor layer 106 side passes through N-type semiconductor layer 106, and is incident on polarizer layer 107. The light which is generated in active layer 105 and heads for P-type semiconductor layer 104 side passes through P-type semiconductor layer 104 and wavelength plate layer 103, is reflected by reflective layer 102, passes through wavelength plate layer 103, P-type semiconductor layer 104, active layer 105 and N-type semiconductor layer 106, and is incident on polarizer layer 107.

Polarizer layer 107 allows a polarized component in a first direction among incident lights to pass therethrough, and reflects a polarized component in a second direction which is perpendicular to the first direction. In other words, the polarized component in the first direction among the lights which have been incident on polarizer layer 107 passes through polarizer layer 107, and the polarized component in the second direction is reflected by polarizer layer 107.

The light which has been reflected by polarizer layer 107 passes through N-type semiconductor layer 106, active layer 105, P-type semiconductor layer 104 and wavelength plate layer 103, is reflected by reflective layer 102, passes through wavelength plate layer 103, P-type semiconductor layer 104, active layer 105 and N-type semiconductor layer 106, and is incident on polarizer layer 107 again.

Wavelength plate layer 103 changes the polarization states of the light which has been reflected by polarizer layer 107 and the light which has been reflected by reflective layer 102. At this time, the light which has been reflected by polarizer layer 107, has been reflected by reflective layer 102 and is again incident on polarizer layer 107 is reciprocated between polarizer layer 107 and wavelength plate layer 103; thereby the polarization state is changed; and the resultant light has the polarized component in the first direction.

The polarized component in the first direction among the lights which have been incident on polarizer layer 107 again passes through polarizer layer 107, and the polarized component in the second direction is reflected by polarizer layer 107. By repeating this action, all of the lights which have been generated in active layer 105 eventually pass through polarizer layer 107. As a result, the lights emitted from light emitting element 100 become the linearly polarized light whose polarization direction is the first direction.

For information, when light emitting element 100 emits light having a green colored component, MgSe/BeZnTe which has been doped with N, for instance, may be used for the material of P-type semiconductor layer 104, BeZnSeTe, for instance, may be used for the material of active layer 105, and MgSe/ZnCdSe which has been doped with Cl, for instance, may be used for the material of N-type semiconductor layer 106. Any one of the materials is a semiconductor of groups II to VI.

Specific structures of polarizer layer 107 and wavelength plate layer 103 will be described below.

Figure 2:
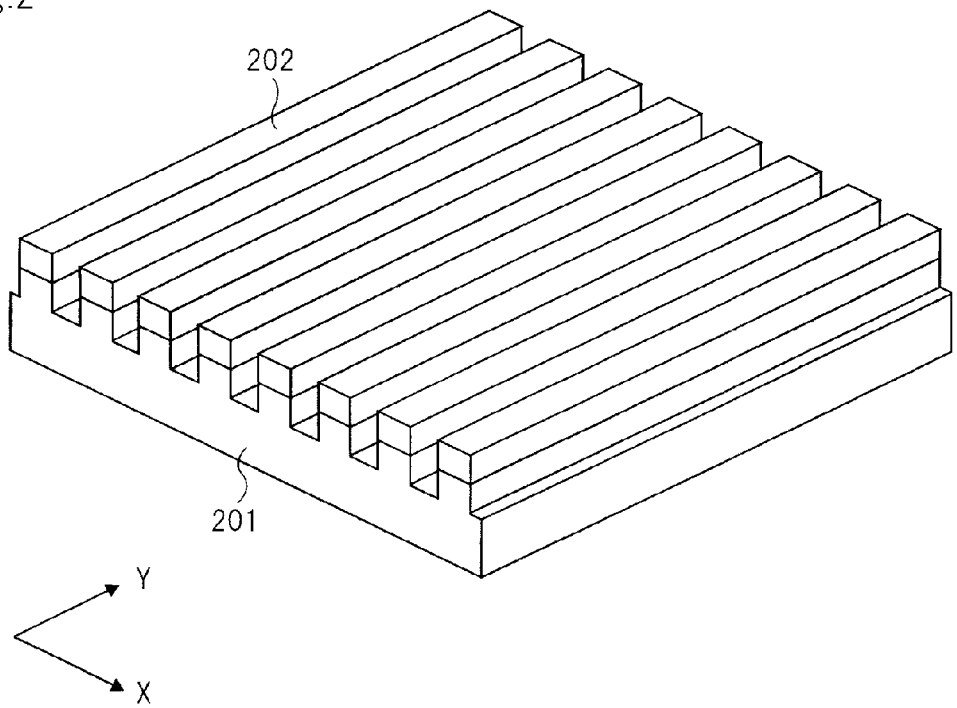
FIG. 2 is a perspective view illustrating one structure example of polarizer layer 107 in FIG. 1.

FIG. 2 is a perspective view illustrating one structure example of polarizer layer 107 in FIG. 1.

In the example illustrated in FIG. 2, grooves are formed into a stripe shape on the surface of N-type semiconductor layer 201, and metal 202 is formed into a stripe shape on the salients of the grooves. The salients of the grooves and metal 202 compose the polarizer layer. The longitudinal direction of the salients of the grooves and metal 202 is the Y-axis direction in the figure. This polarizer layer allows the polarized component in the X-axis direction in the figure among the incident lights to pass therethrough, which is perpendicular to the longitudinal direction of the grooves and a stacked direction of metal 202, and reflects the polarized component in the Y-axis direction in the figure.

When light emitting element 100 emits blue or green colored light, GaN which has been doped with Si, for instance, is used for a material of N-type semiconductor layer 201. When light emitting element 100 emits light having a red colored component, InGaAlP which has been doped with Si, for instance, is used for a material of N-type semiconductor layer 201. Al, for instance, is used for a material of metal 202.

A method for manufacturing the polarizer layer illustrated in FIG. 2 will be described below. Firstly, metal 202 is formed on the whole face of the surface of N-type semiconductor layer 201. Next, a photoresist is applied on metal 202. Next, a photoresist is patterned into a stripe shape by exposure and development with the use of a photomask. Next, metal 202 is formed into the stripe shape, and grooves with the stripe shape are also formed on the surface of N-type semiconductor layer 201, by etching with the use of the patterned photoresist for a mask. Finally, the photoresist is removed.

Figure 3:
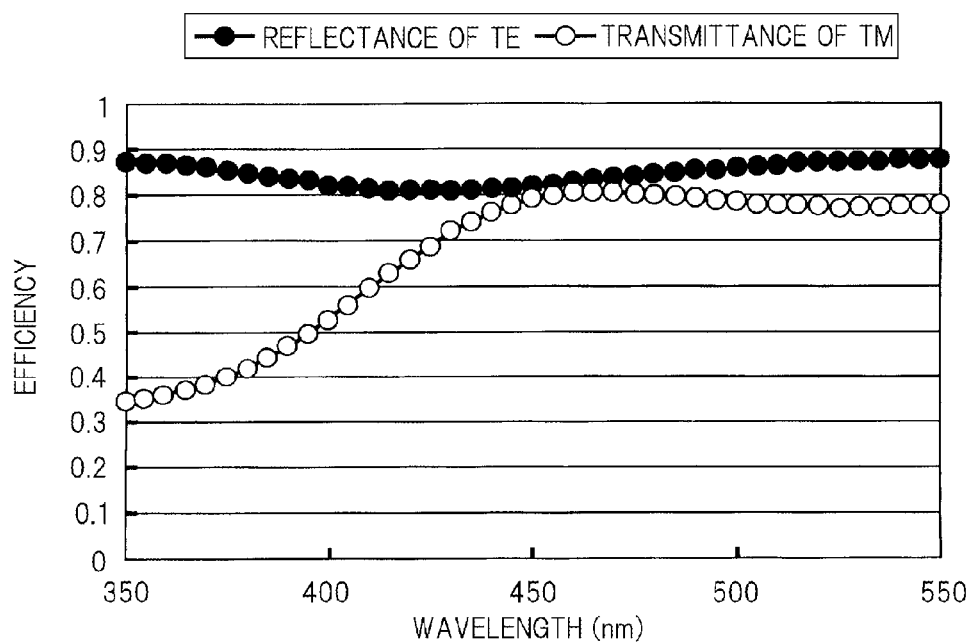
FIG. 3 is a view illustrating a calculation example of a relationship between a wavelength and efficiency in the polarizer layer illustrated in FIG. 2.

FIG. 3 is a view illustrating a calculation example of the relationship between a wavelength and efficiency in the polarizer layer illustrated in FIG. 2. In the calculation, the case was assumed in which light emitting element 100 emitted light having a blue colored component; and GaN was used for a material of N-type semiconductor layer 201, and Al was used for the material of metal 202. In addition, a period of the salients of the grooves formed on the surface of N-type semiconductor layer 201 and of metal 202 was set at 100 nm, the width thereof was set at 50 nm, the height of the salients of the grooves was set at 200 nm, and the thickness of metal 202 was set at 200 nm. In the figure, the horizontal axis represents the wavelength, and the vertical axis represents the efficiency. In addition, the closed circle represents the reflectance of a TE polarized component (polarized component in the Y-axis direction in FIG. 2), and the open circle represents the transmittance of the TM polarized component (polarized component in the X-axis direction in FIG. 2).

The reflectance of the TE polarized component and the transmittance of the TM polarized component are high in the vicinity of the wavelength of 450 nm, and it is understood that this polarizer layer allows the TM polarized component to pass therethrough and reflects the TE polarized component. The reflectance of the TE polarized component is 82%, and the transmittance of the TM polarized component is 79%, at the wavelength of 450 nm. This polarizer layer has a slightly low efficiency at the center wavelength, but has a wide wavelength band.

In other words, the light emitting element can obtain the effect of being capable of emitting linearly polarized light in a wide wavelength band, by employing the polarizer layer illustrated in FIG. 2 therein.

In the example illustrated in FIG. 2, the grooves are formed into the stripe shape on the surface of N-type semiconductor layer 201, and metal 202 is formed into the stripe shape on the salients of the grooves, but metal 202 may also be formed into the stripe shape on N-type semiconductor layer 201 which has no groove formed on its surface.

Figure 4:
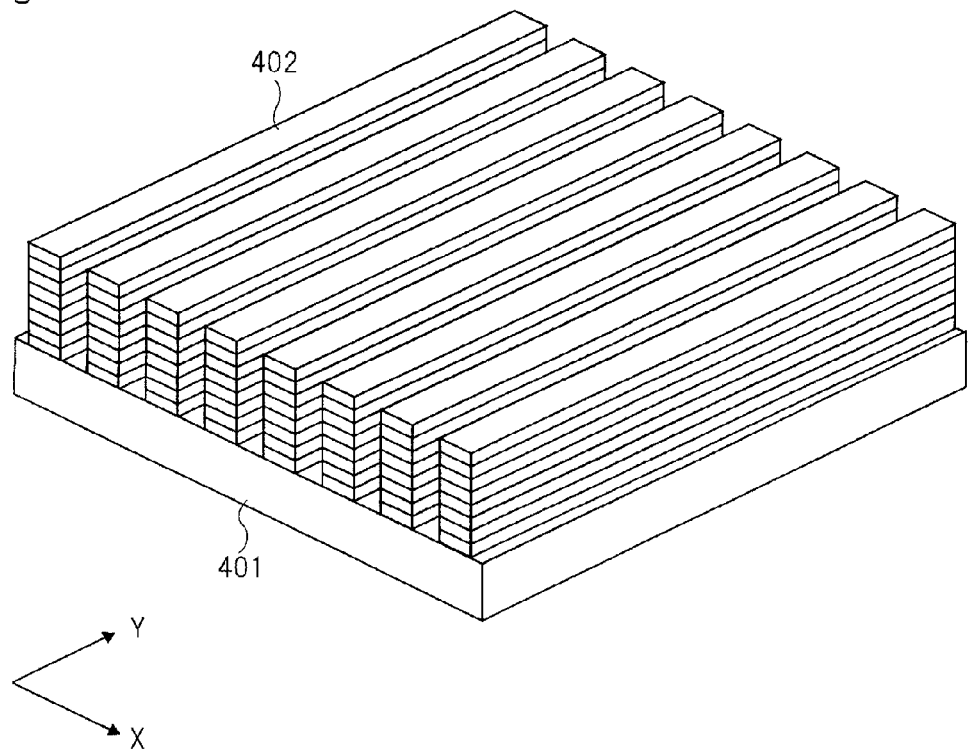
FIG. 4 is a perspective view illustrating another structure example of polarizer layer 107 in FIG. 1.

FIG. 4 is a perspective view illustrating another structure example of polarizer layer 107 in FIG. 1.

In the example illustrated in FIG. 4, semiconductors 402 which have been stacked on N-type semiconductor layer 401 are formed into a stripe shape. Semiconductors 402 are formed in such a way that layers with high refractive indices and layers with low refractive indices are alternately stacked. Semiconductors 402 compose a polarizer layer. The longitudinal direction of semiconductors 402 is the Y-axis direction in the figure. This polarizer layer allows the polarized component in the X-axis direction in the figure among the incident lights to pass therethrough, which is perpendicular to the longitudinal direction of the grooves and the stacked direction of semiconductors 402, and reflects the polarized component in the Y-axis direction in the figure.

When light emitting element 100 emits blue or green colored light, GaN which has been doped with Si, for instance, is used for the material of N-type semiconductor layer 401. GaN which has been doped with Si and AlN which has been doped with Si, for instance, are used for materials of the layers with high refractive indices and the layers with low refractive indices in semiconductors 402, respectively. When light emitting element 100 emits light having a red colored component, InGaAlP which has been doped with Si, for instance, is used for the material of N-type semiconductor layer 401. InGaAlP which has been doped with Si and InAlP which has been doped with Si, for instance, are used for materials of the layers with high refractive indices and the layers with low refractive indices in semiconductors 402, respectively.

A method for manufacturing the polarizer layer illustrated in FIG. 4 will be described below. Firstly, semiconductors 402 are formed in such a way that the layers with high refractive indices and the layers with low refractive indices are alternately stacked on the whole face of the surface of N-type semiconductor layer 401. Next, a photoresist is applied onto semiconductors 402. Next, a photoresist is patterned into the stripe shape by exposure and development with the use of a photomask. Next, the semiconductors 402 are formed into the stripe shape by etching with the use of the patterned photoresist for a mask. Finally, the photoresist is removed.

Figure 5:
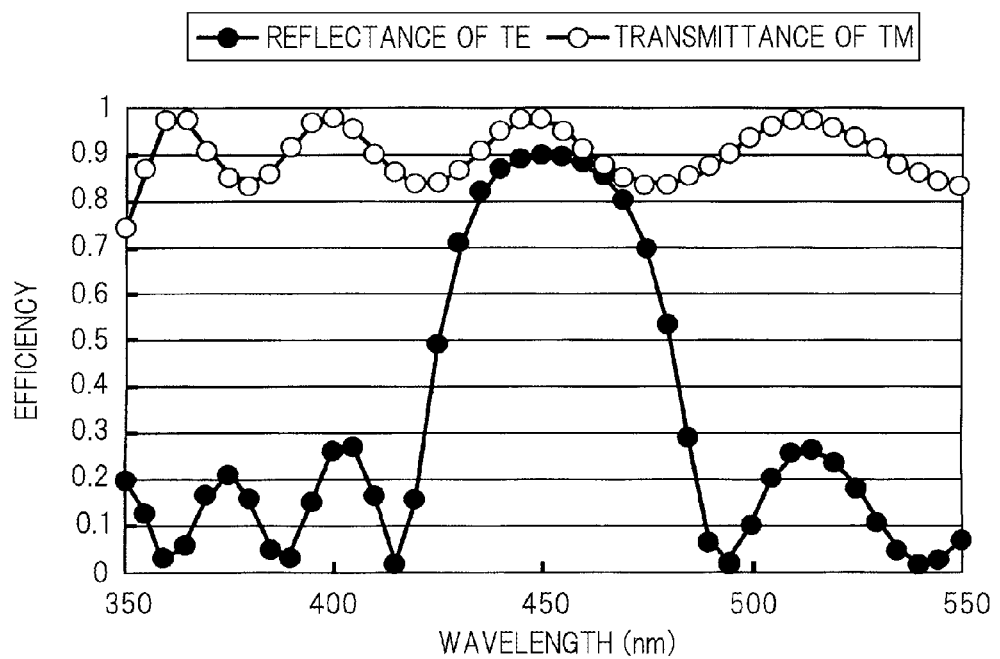
FIG. 5 is a view illustrating a calculation example of a relationship between a wavelength and efficiency in the polarizer layer illustrated in FIG. 4.

FIG. 5 is a view illustrating a calculation example of a relationship between a wavelength and efficiency in the polarizer layer illustrated in FIG. 4. In the calculation, the case was assumed in which light emitting element 100 emitted light having a blue colored component; and GaN was used for the material of N-type semiconductor layer 401, and GaN and AlN were used for the materials of the layers with high refractive indices and the layers with low refractive indices in semiconductors 402, respectively. In addition, the period of semiconductors 402 was set at 100 nm, the width thereof was set at 50 nm, the thicknesses of the layers with high refractive indices and the layers with low refractive indices in semiconductors 402 were set at 67 nm and 58 nm respectively, and the numbers of the layers were each set at ten layers. In FIG. 5, the horizontal axis represents the wavelength, and the vertical axis represents the efficiency. In addition, the black circle represents the reflectance of the TE polarized component (polarized component in the Y-axis direction in FIG. 4), and the open circle represents the transmittance of the TM polarized component (polarized component in the X-axis direction in FIG. 4).

The reflectance of the TE polarized component and the transmittance of the TM polarized component are high in the vicinity of the wavelength of 450 nm, and it is understood that this polarizer layer allows the TM polarized component to pass therethrough and reflects the TE polarized component. The reflectance of the TE polarized component is 89%, and the transmittance of the TM polarized component is 97%, at the wavelength of 450 nm. This polarizer layer has a slightly narrow wavelength band, but has high efficiency at the center wavelength.

In other words, the light emitting element can obtain the effect of being capable of emitting linearly polarized light at the center wavelength, by employing the polarizer layer illustrated in FIG. 4 therein.

Figure 6:
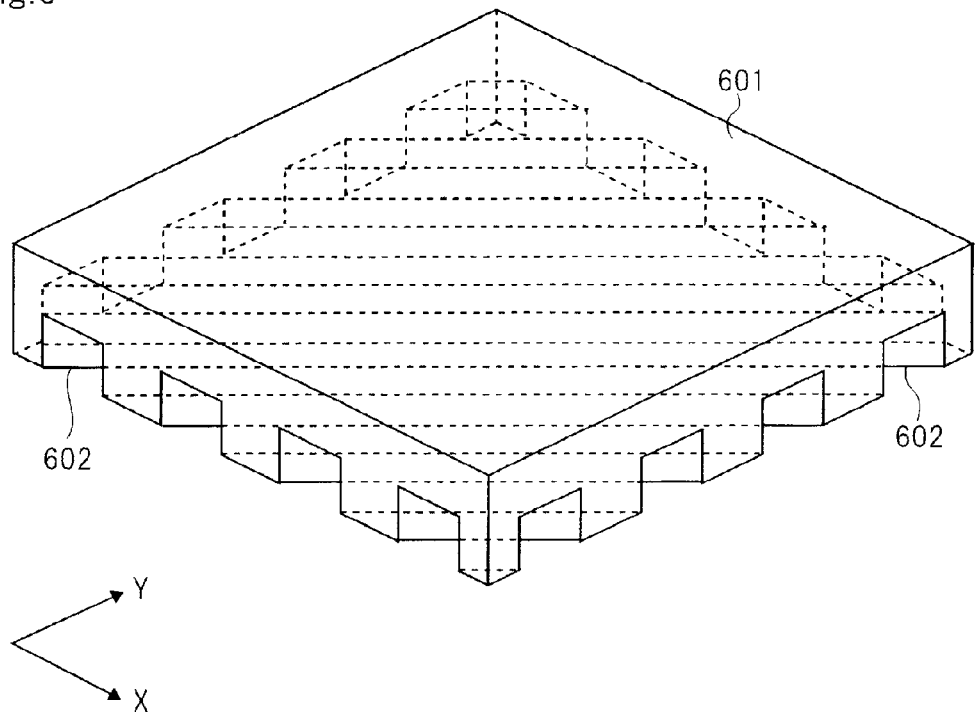
FIG. 6 is a perspective view illustrating one structure example of wavelength plate layer 103 in FIG. 1.

FIG. 6 is a perspective view illustrating one structure example of wavelength plate layer 103 in FIG. 1.

In the example illustrated in FIG. 6, grooves 602 are formed into a stripe shape on the rear face of P-type semiconductor layer 601. The salients of grooves 602 compose the wavelength plate layer. The longitudinal direction of the salients of grooves 602 forms an angle of 45° with respect to the X-axis direction and the Y-axis direction in the figure. This wavelength plate layer gives a phase difference of approximately 180° between the polarized component parallel to the longitudinal direction of the salients of grooves 602 and the polarized component perpendicular to the longitudinal direction thereof, to the light which has been incident from the polarizer layer 107 side, which is reflected by reflective layer 102 and which is emitted toward the polarizer layer 107 side. In other words, a layer formed by the method of combining this wavelength plate layer and reflective layer 102 works as a reflection type of a ½ wavelength plate. At this time, the linearly polarized light which has been incident on the wavelength plate layer from the polarizer layer 107 side and has had the polarization direction of the Y-axis direction in the figure is emitted toward the polarizer layer 107 side from the wavelength plate layer as the linearly polarized light whose polarization direction is the X-axis direction in the figure.

When light emitting element 100 emits light have a blue or green colored component, GaN which has been doped with Mg, for instance, is used for the material of P-type semiconductor layer 601. When light emitting element 100 emits light having a red colored component, InGaAlP which has been doped with Zn, for instance, is used for the material of P-type semiconductor layer 601.

A method for manufacturing the wavelength plate layer illustrated in FIG. 6 will be described below. Firstly, a photoresist is applied onto the rear face of P-type semiconductor layer 601. Next, a photoresist is patterned into a stripe shape by exposure and development with the use of a photomask. Next, stripe-shaped grooves 602 are formed on the rear face of P-type semiconductor layer 601 by etching with the use of the patterned photoresist for a mask. Finally, the photoresist is removed.

Figure 7:
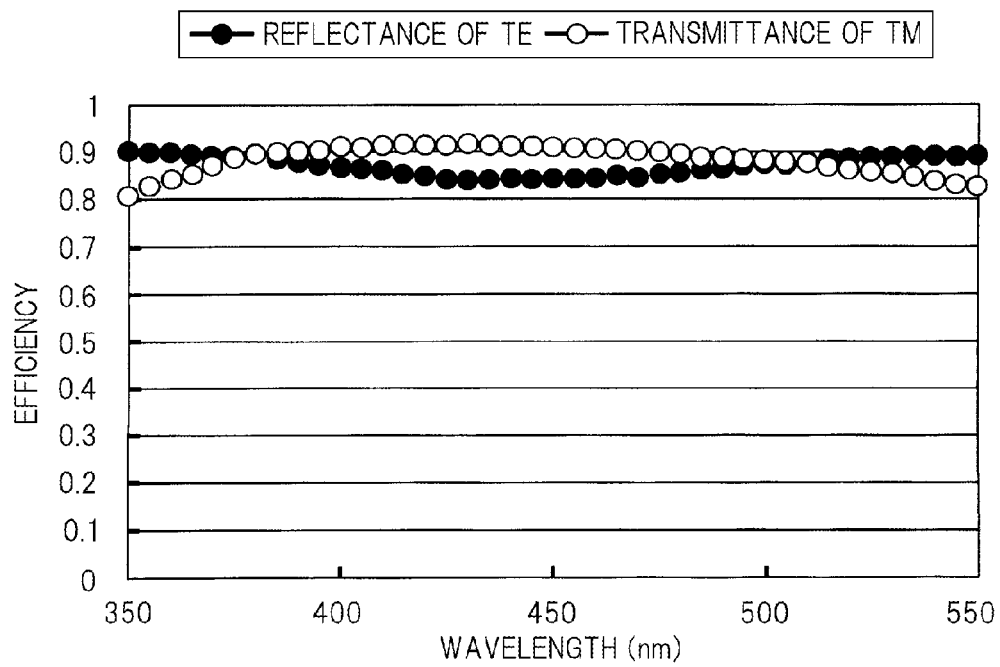
FIG. 7 is a view illustrating a calculation example of a relationship between a wavelength and efficiency in the wavelength plate layer illustrated in FIG. 6.

FIG. 7 is a view illustrating a calculation example of a relationship between a wavelength and efficiency in the wavelength plate layer illustrated in FIG. 6. In the calculation, the case was assumed in which light emitting element 100 emitted light having a blue colored component; and GaN was used for the material of P-type semiconductor layer 601, and Al was used for the material of reflective layer 102. In addition, a period of grooves 602 was set at 100 nm, the width thereof was set at 50 nm, and the depth thereof was set at 215 nm. In the figure, the horizontal axis represents the wavelength, and the vertical axis represents the efficiency. In addition, a closed circle represents the reflectance of the TE polarized component (polarized component parallel to longitudinal direction of salients of grooves 602), and the open circle represents the transmittance of the TM polarized component (polarized component perpendicular to longitudinal direction of salients of grooves 602). Here, the reflectance is a ratio of the light which is emitted toward the polarizer layer 107 side from the wavelength plate layer, with respect to the light which has been incident on the wavelength plate layer from the polarizer layer 107 side.

The reflectance of the TE polarized component and the transmittance of the TM polarized component are high in the vicinity of the wavelength of 450 nm, and it is understood that a layer formed by the method of combining this wavelength plate layer and reflective layer 102 reflects both the TE polarized component and the TM polarized component. The reflectance of the TE polarized component is 84%, and the transmittance of the TM polarized component is 91%, at the wavelength of 450 nm.

Figure 8:
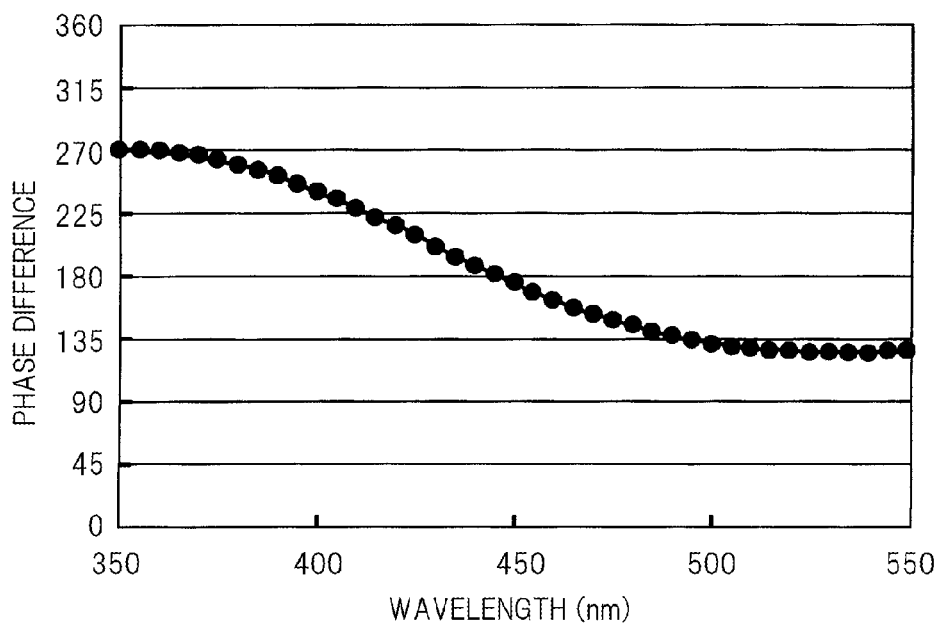
FIG. 8 is a view illustrating a calculation example of a relationship between a wavelength and a phase difference in the wavelength plate layer illustrated in FIG. 6.

FIG. 8 is a view illustrating a calculation example of a relationship between a wavelength and a phase difference in the wavelength plate layer illustrated in FIG. 6. The calculation condition is the same as that described in FIG. 7. The horizontal axis in the figure represents the wavelength, and the vertical axis represents a phase difference between the TE polarized component and the TM polarized component, which is given by reciprocation through the wavelength plate layer.

The phase difference is approximately 180° in the vicinity of the wavelength of 450 nm, and it is understood that a layer formed by the method of combining this wavelength plate layer and reflective layer 102 works as a reflection type of a ½ wavelength plate. The phase difference is 174° at the wavelength of 450 nm.

The phase difference between the TE polarized component and the TM polarized component, which is given by reciprocation through the wavelength plate layer, does not need to be approximately 180°, but may also be smaller than 180°. At this time, the linearly polarized light which has been incident on the wavelength plate layer from the polarizer layer 107 side and which has the polarization direction of the Y-axis direction in FIG. 6 (light having no polarized component in the X-axis direction in FIG. 6) is emitted toward the polarizer layer 107 side from the wavelength plate layer as the light having the polarized component in the X-axis direction in FIG. 6. The depth of grooves 602 can be made shallower by method that decreases the phase difference between the TE polarized component and the TM polarized component, which is given by reciprocation through the wavelength plate layer, and the wavelength plate layer is easily manufactured.

Figure 9:
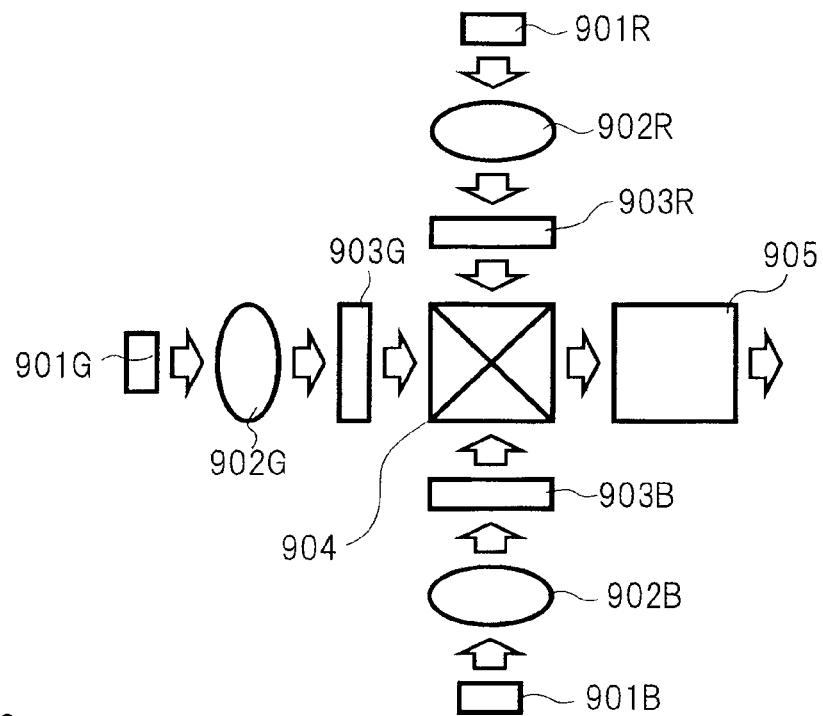
FIG. 9 is a block diagram illustrating a structure of one exemplary embodiment of an image display device using a light emitting element according to the present invention.

FIG. 9 is a block diagram illustrating a structure of one exemplary embodiment of an image display device using a light emitting element according to the present invention. The image display device of the present exemplary embodiment is a device which forms an image by using liquid crystal display elements 903R, 903G and 903B composed of a plurality of pixels, and each pixel has liquid crystal molecules whose orientation direction can be individually controlled.

The image display device illustrated in FIG. 9 includes light source unit 901R which generates red light, light source unit 901G which generates green light, and light source unit 901B which generates blue light. These light source units are structured while using one or more light emitting elements according to the present invention, which have been described with reference to FIG. 1 to FIG. 8.

The red light which has been generated in light source unit 901R irradiates liquid crystal display element 903R which displays an image for red, through condensing lens 902R, and the red image light thereby generated in liquid crystal display element 903R is incident on color synthesizing prism 904.

The green light which has been generated in light source unit 901G irradiates liquid crystal display element 903G which displays an image for green, through condensing lens 902G, and the green image light thereby generated in liquid crystal display element 903G is incident on color synthesizing prism 904.

The blue light which has been generated in light source unit 901B irradiates liquid crystal display element 903B which displays an image for blue, through condensing lens 902B, and the blue image light thereby generated in liquid crystal display element 903B is incident on color synthesizing prism 904.

The red image light, the green image light and the blue image light which have been incident on color synthesizing prism 904 are synthesized in color synthesizing prism 904, and the synthesized image light is projected onto a screen through projection lens 905.

The image display device of the present exemplary embodiment does not generate an optical loss of 50% in liquid crystal display elements 903R, 903G and 903B, compared to an image display device including a similar structure that uses light source units in which the polarization states of emission lights are not uniform, and accordingly can increase its luminance to twice the luminance of the compared device.

Figure 10:
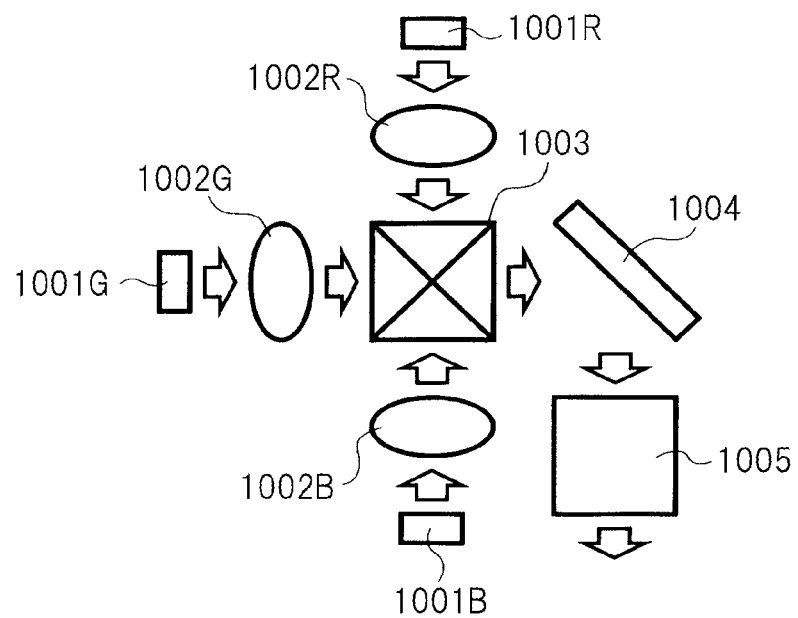
FIG. 10 is a block diagram illustrating a structure of another exemplary embodiment of an image display device using a light emitting element according to the present invention.

FIG. 10 is a block diagram illustrating the structure of another exemplary embodiment of an image display device using a light emitting element according to the present invention. The image display device of the present exemplary embodiment is a device which forms an image by using micromirror 1004 composed of a plurality of pixels, and each pixel has a micromirror whose angle can be individually controlled.

The image display device illustrated in FIG. 10 includes light source unit 1001R which generates red light, light source unit 1001G which generates green light, and light source unit 1001B which generates blue light. These light source units are structured while using one or more light emitting elements according to the present invention, which have been described with reference to FIG. 1 to FIG. 8.

The red light which has been generated in light source unit 1001R is incident on color synthesizing prism 1003 through condensing lens 1002R. The red light which has been generated in light source unit 1001G is incident on color synthesizing prism 1003 through condensing lens 1002G. The red light which has been generated in light source unit 1001B is incident on color synthesizing prism 1003 through condensing lens 1002B.

Light source unit 1001R, light source unit 1001G and light source unit 1001B can be controlled so that the lighted state of each color can be switched in rotation, and micromirror 1004 is irradiated with the red light, the green light and the blue light emitted from color synthesizing prism 1003 in rotation.

Micromirror 1004 displays an image in rotation according to the color of the irradiating light. Thereby, the red image light, the green image light and the blue image light which have been generated in micromirror 1004 are projected onto a screen in rotation through projecting lens 1005.

Color synthesizing prism 1003 reflects all of S polarized components of the red light, allows all of P polarized components of the green light to pass therethrough and reflects all of S polarized components of the blue light; but reflects only a part of P polarized components of the red light, allows only a part of S polarized components of the green light to pass therethrough and reflects only a part of P polarized components of the blue light.

For this reason, when the polarization states of the lights emitted from the light source units are not uniform, in any of the red light, the green light and the blue light, an optical loss is not generated in one polarized component, but the optical loss is generated in the other polarized component, in color synthesizing prism 1003.

In contrast to this, when the light emitted from the light source units is linearly polarized light, if the S polarized component of the red light, the P polarized component of the green light and the S polarized component of the blue light are incident on color synthesizing prism 1003, optical loss is not generated in any of the red light, the green light and the blue light, in color synthesizing prism 1003.

In other words, the image display device of the present exemplary embodiment does not generate the optical loss in color synthesizing prism 1003, compared to the image display device including a similar structure using light source units in which the polarization states of the emission lights are not uniform, and accordingly can enhance its luminance.

Figure 11:
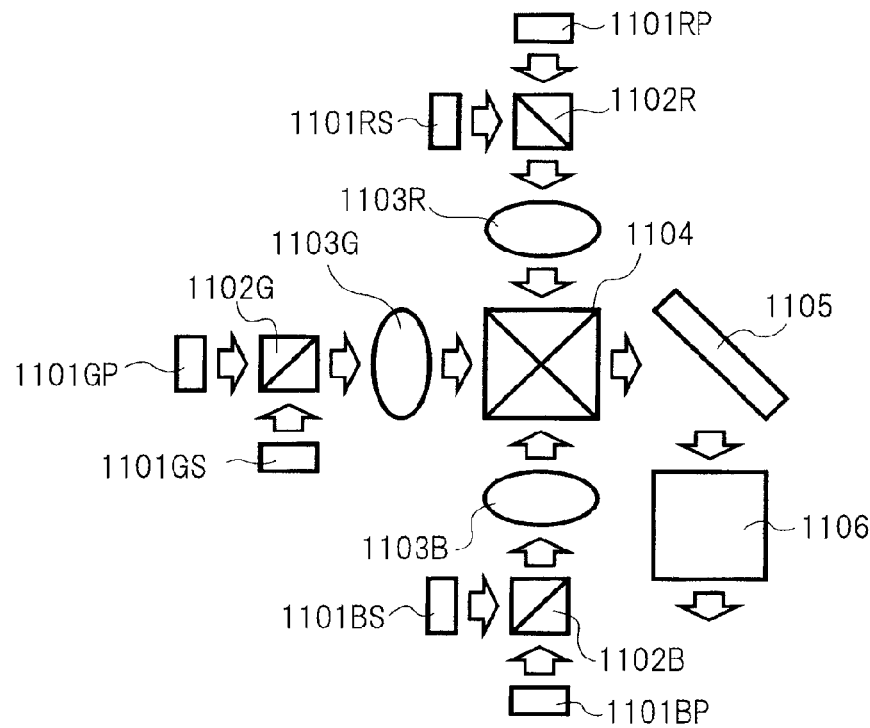
FIG. 11 is a block diagram illustrating a structure of another exemplary embodiment of an image display device using a light emitting element according to the present invention.

FIG. 11 is a block diagram illustrating the structure of another exemplary embodiment of an image display device using a light emitting element according to the present invention. The image display device of the present exemplary embodiment is a device which forms an image by using micromirror 1105 composed of a plurality of pixels, and each pixel has a micromirror whose angle can be individually controlled.

The image display device illustrated in FIG. 11 includes: light source units 1101RP and 1101RS which generate red light; light source units 1101GP and 1101GS which generate green light; and light source units 1101BP and 1101BS which generate blue light. These light source units are structured while using one or more light emitting elements according to the present invention, which have been described with reference to FIG. 1 to FIG. 8.

The red lights which have been generated in light source units 1101RP and 1101RS are incident on polarization beam splitter 1102R as P polarized light and S polarized light, respectively. Polarization beam splitter 1102R allows the P polarized light to pass therethrough, and reflects the S polarized light. Accordingly, the red lights which have been generated in light source units 1101RP and 1101RS are synthesized in polarization beam splitter 1102R, and the synthesized red light is incident on color synthesizing prism 1104 through condensing lens 1103R.

The green lights which have been generated in light source units 1101GP and 1101GS are incident on polarization beam splitter 1102G as P polarized light and S polarized light, respectively. Polarization beam splitter 1102G allows the P polarized light to pass therethrough, and reflects the S polarized light. Accordingly, the green lights which have been generated in light source units 1101GP and 1101GS are synthesized in polarization beam splitter 1102G, and the synthesized green light is incident on color synthesizing prism 1104 through condensing lens 1103G.

The blue lights which have been generated in light source units 1101BP and 1101BS are incident on polarization beam splitter 1102B as P polarized light and S polarized light, respectively. Polarization beam splitter 1102B allows the P polarized light to pass therethrough, and reflects the S polarized light. Accordingly, the blue lights which have been generated in light source units 1101BP and 1101BS are synthesized in polarization beam splitter 1102B, and the synthesized blue light is incident on color synthesizing prism 1104 through condensing lens 1103B.

Light source units 1101RP and 1101RS, light source units 1101GP and 1101GS and light source units 1101BP and 1101BS can be controlled so that the lighting state of each color can be switched in rotation, and micromirror 1105 is irradiated with the red light, the green light and the blue light emitted from color synthesizing prism 1104, in rotation.

Micromirror 1105 displays an image according to the color of the irradiating light in rotation. Thereby, the red image light, the green image light and the blue image light which have been generated in micromirror 1105 are projected onto a screen in rotation through projecting lens 1106.

When the polarization states of the lights emitted from the light source units are not uniform, an optical loss of 50% is generated in the polarization beam splitter, and accordingly the image display device illustrated in FIG. 11 cannot increase the luminance even though it has twice the number of the light source units compared to that in the image display device including the structure illustrated in FIG. 10.

In contrast to this, when the light emitted from the light source units is linearly polarized light, an optical loss of 50% is not generated in the polarization beam splitter, and accordingly the image display device illustrated in FIG. 11 can enhance the luminance twice as much by having twice the number of the light source units compared to that in the image display device including the structure illustrated in FIG. 10.

Figure 12:
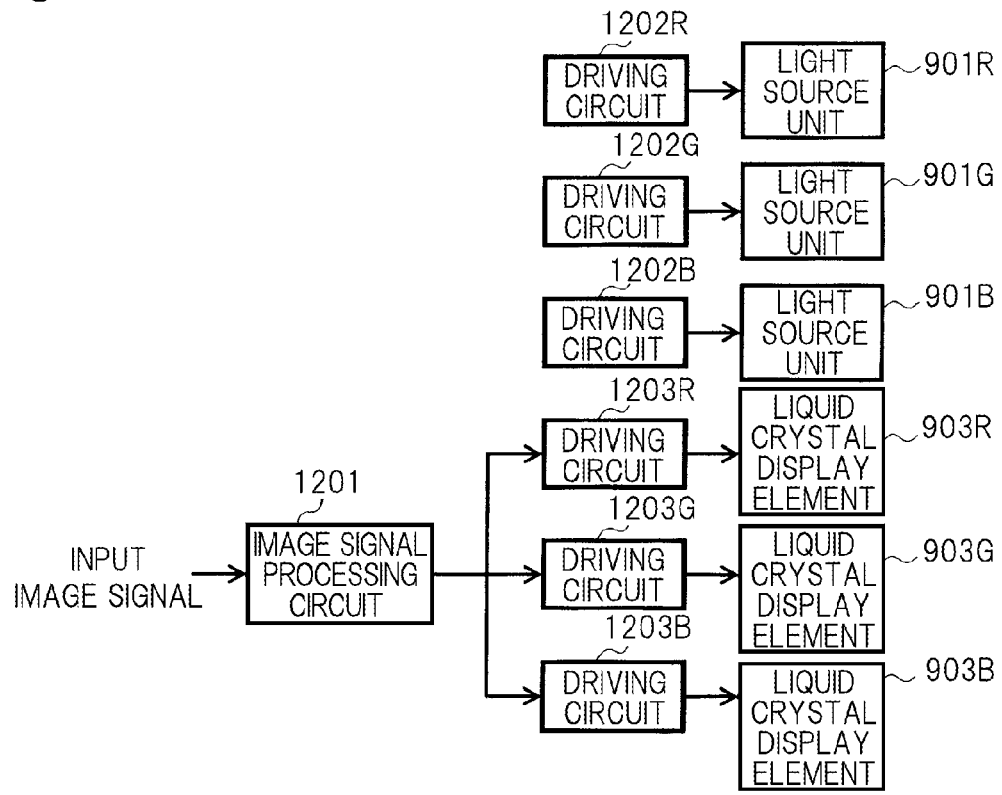
FIG. 12 is a view illustrating a structure of a driving system of the image display device illustrated in FIG. 9.

FIG. 12 is a view illustrating a structure of a driving system of the image display device illustrated in FIG. 9.

Driving circuits 1202R, 1202G and 1202B drive light source units 901R, 901G and 901B, respectively. Thereby, light source units 901R, 901G and 901B are always in a lighting state when an image display is operating. For reference, light source units 901R, 901G and 901B may also be driven by one driving circuit.

Image signal processing circuit 1201 generates signals for displaying an image for red, an image for green and an image for blue according to input image signals given by an external PC (personal computer), a picture reproducer or the like, and supplies the respective signals to the driving circuits 1203R, 1203G and 1203B.

Driving circuits 1203R, 1203G and 1203B drive liquid crystal display elements 903R, 903G and 903B, respectively, according to signals supplied from image signal processing circuit 1201. Thereby, liquid crystal display elements 903R, 903G and 903B display the image for red, the image for green and the image for blue, respectively.

Figure 13:
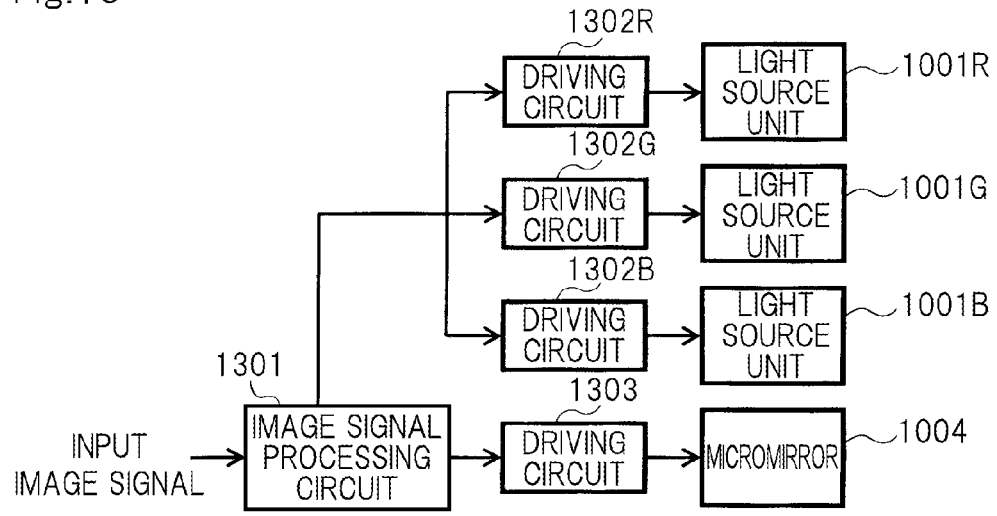
FIG. 13 is a view illustrating a structure of a driving system of the image display device illustrated in FIG. 10.

FIG. 13 is a view illustrating a structure of a driving system of the image display device illustrated in FIG. 10.

Image signal processing circuit 1301 generates signals for displaying an image for red, an image for green and an image for blue according to input image signals given by an external PC, a picture reproducer or the like, and supplies these signals to driving circuit 1303 in rotation.

In addition, image signal processing circuit 1301 generates a signal for generating red light and supplies this signal to driving circuit 1302R, at the same time as supplying the signal for displaying the image for red to driving circuit 1303; generates a signal for generating green light and supplies this signal to driving circuit 1302G, at the same time as supplying the signal for displaying the image for green to driving circuit 1303; and generates a signal for generating blue light and supplies this signal to driving circuit 1302B, at the same time as supplying the signal for displaying the image for blue to driving circuit 1303.

Driving circuit 1303 drives micromirror 1004 according to the signal supplied from image signal processing circuit 1301. Thereby, micromirror 1004 displays the image for red, the image for green and the image for blue, in rotation.

Driving circuits 1302R, 1302G and 1302B drive light source units 1001R, 1001G and 1001B, respectively, according to the signal supplied from image signal processing circuit 1301. Thereby, when micromirror 1004 displays the image for red, light source unit 1001R lights up, when micromirror 1004 displays the image for green, light source unit 1001G lights up, and when micromirror 1004 displays the image for blue, light source unit 1001B lights up.

Figure 14:
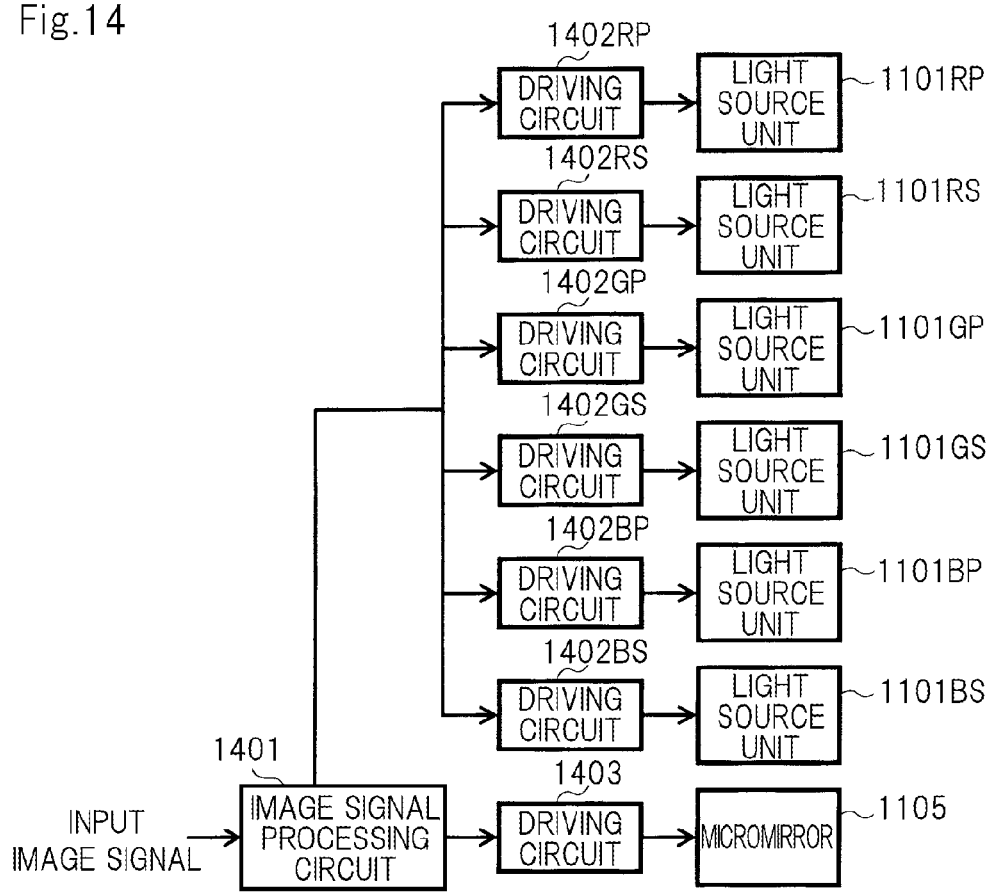
FIG. 14 is a view illustrating a structure of a driving system of the image display device illustrated in FIG. 11.

FIG. 14 is a view illustrating the structure of a driving system of the image display device illustrated in FIG. 11.

Image signal processing circuit 1401 generates signals for displaying an image for red, an image for green and an image for blue according to an input image signal given by an external PC, a picture reproducer or the like, and supplies these signals to driving circuit 1403 in rotation.

In addition, image signal processing circuit 1401 generates a signal for generating red light and supplies this signal to driving circuits 1402RP and 1402RS, at the same time as supplying the signal for displaying the image for red to the driving circuit 1403; generates a signal for generating green light and supplies this signal to driving circuits 1402GP and 1402GS, at the same time as supplying the signal for displaying the image for green to driving circuit 1403; and generates a signal for generating blue light and supplies this signal to the driving circuits 1402BP and 1402BS, at the same time as supplying the signal for displaying the image for blue to driving circuit 1403.

Driving circuit 1403 drives micromirror 1105 according to the signal supplied from image signal processing circuit 1401. Thereby, micromirror 1105 displays the image for red, the image for green and the image for blue, in rotation.

Driving circuits 1402RP, 1402RS, 1402GP, 1402GS, 1402BP and 1402BS drive light source units 1101RP, 1101RS, 1101GP, 1101GS, 1101BP and 1101BS, respectively, according to the signal supplied from image signal processing circuit 1401. Thereby, when micromirror 1105 displays the image for red, light source units 1101RP and 1101RS light up, when micromirror 1004 displays the image for green, light source units 1101GP and 1101GS light up, and when micromirror 1004 displays the image for blue, light source units 1101BP and 1101BS light up.

This patent application claims priority on the basis of JP2010-002068 applied on Jan. 7 in 2010, the disclosure of which is hereby incorporated by reference herein in its entirety.

REFERENCE SIGNS LIST

100 Light emitting element
101 Submount
102 Reflective layer
103 Wavelength plate layer
104 P-type semiconductor layer
105 Active layer
106 N-type semiconductor layer
107 Polarizer layer

The invention claimed is:

1. A light emitting element comprising:
an active layer composed of a semiconductor which generates light;
a polarizer layer that allows a polarized component in a first direction among the lights generated in said active layer to pass therethrough, and reflects a polarized component in a second direction which is perpendicular to the first direction;
a reflective layer that is provided in the opposite side of said polarizer layer with respect to said active layer, and reflects light which has been reflected by said polarizer layer; and
a wavelength plate layer that is provided between said polarizer layer and said reflective layer, and changes polarization states of the light which has been reflected by said polarizer layer and light which has been reflected by said reflective layer, wherein
said polarizer layer is formed on a semiconductor of the same group as said active layer and contains a semiconductor or a metal of the same group as said active layer, and
said wavelength plate layer contains a semiconductor of the same group as said active layer.

2. The light emitting element according to claim 1, wherein said polarizer layer has a structure in which a metal is formed into a stripe shape on the semiconductor of the same group as said active layer.

3. The light emitting element according to claim 1, wherein said polarizer layer has a structure in which a first semiconductor formed into a stripe shape and a second semiconductor formed into a stripe shape are alternately stacked on the semiconductor of the same group as said active layer.

4. The light emitting element according to claim 1, wherein the semiconductor composing said active layer is a semiconductor of groups III to V, said semiconductor of said groups III to V including In, Ga and N, and the semiconductor from which said polarizer layer is formed is a semiconductor of said groups III to V, said semiconductor of said groups III to V including Ga and N.

5. The light emitting element according to claim 1, wherein the semiconductor composing said active layer is a semiconductor of groups III to V, said semiconductor of said groups III to V including In, Ga, Al and P, and a semiconductor from which said polarizer layer is formed is a semiconductor of said groups III to V, said semiconductor of said groups III to V including In, Ga, Al and P.

6. The light emitting element according to claim 1, wherein said wavelength plate layer has a structure in which the semiconductor is formed into a stripe shape.

7. The light emitting element according to claim 1, wherein the semiconductor composing said active layer is a semiconductor of groups III to V, said semiconductor of said groups III to V including In, Ga and N, and a semiconductor which included in said wavelength plate layer is a semiconductor of said groups III to V, said semiconductor of said groups III to V including Ga and N.

8. The light emitting element according to claim 1, wherein the semiconductor composing said active layer is a semiconductor of groups III to V, said semiconductor of said groups III to V including In, Ga, Al and P, and a semiconductor which included in said wavelength plate layer is a semiconductor of said groups III to V, said semiconductor of said groups III to V including In, Ga, Al and P.

9. An image display device that uses the light emitting element according to claim 1.

* * * * *